United States Patent [19]

Prioste et al.

[11] Patent Number: 4,556,947
[45] Date of Patent: Dec. 3, 1985

[54] BI-DIRECTIONAL SWITCHING CIRCUIT

[75] Inventors: Jerry E. Prioste, Scottsdale; David E. Lopez, Tempe, both of Ariz.

[73] Assignee: Motorola, Inc., Schaumburg, Ill.

[21] Appl. No.: 410,294

[22] Filed: Aug. 23, 1982

[51] Int. Cl.$^4$ .............................................. G06F 15/20
[52] U.S. Cl. ................................... 364/550; 307/465; 364/481; 371/1; 371/62
[58] Field of Search ............... 364/481, 550; 307/465, 307/480; 324/73 R, 73 AT; 370/108; 371/1, 62

[56] References Cited

U.S. PATENT DOCUMENTS

| Re. 31,056 | 10/1982 | Chau et al. | 371/1 X |
| 4,139,147 | 2/1979 | Franke | 371/1 X |
| 4,450,560 | 5/1984 | Conner | 324/73 AT |

OTHER PUBLICATIONS

"Deskewing System for Parallel Recorded Data", by A. M. Gindi; IBM Technical Disclosure Bulletin, vol. 10. No. 1; pp. 37–39.

Primary Examiner—Errol A. Krass
Assistant Examiner—Edward R. Cosimano
Attorney, Agent, or Firm—William E. Koch

[57] ABSTRACT

A bidirectional switching circuit is provided for testing a large number of AC data paths of LSI macrocell arrays. The circuit includes a plurality of bidirectional pins, a first logic means, and a second logic means. The switching circuit may be used to deskew a general purpose LSI tester wherein any pin may be used for input or output and the pulse at any pin may be inverted. The second logic means, receiving signals on selected pins, initializes the first logic means thereby determining which pins may be used for testing the data path desired.

10 Claims, 5 Drawing Figures

Fig 2

| INVERT(I)/NON-INVERT(NI) | SELECT CONTROL | | | | DECODE INPUT | | | | | AC PROPAGATION PATH | |
|---|---|---|---|---|---|---|---|---|---|---|---|
| | I | $S_{0-2}$ | II | $SS_{0-2}$ | $A_{0-N}$ | $AA_{0-N}$ | $B_{0-N}$ | $BB_{0-N}$ | $C_{0-P}$ | SELECTABLE INPUT PINS | SELECTABLE OUTPUT PINS |
| NI | 0 | 7 | ⇕ | ⇕ | DS | ⇕ | ⇕ | ⇕ | ⇕ | II,SS,AA,BB,C | II,SS,AA,BB,C |
| I  | 1 | 7 | ⇕ | ⇕ | DS | ⇕ | ⇕ | ⇕ | ⇕ | II,SS,AA,BB,C | II,SS,AA,BB,C |
| NI | ⇕ | ⇕ | 0 | 5 | ⇕ | DS | RS | ⇕ | ⇕ | I,S,A,B,C | I,S,A,B,C |
| I  | ⇕ | ⇕ | 1 | 5 | ⇕ | DS | RS | ⇕ | ⇕ | I,S,A,B,C | I,S,A,B,C |
| NI | ⇕ | 3 | 0 | 3 | DS | RS | ⇕ | RS | X | I,S*,AA | I,S,AA |
| I  | ⇕ | 3 | 1 | 3 | DS | RS | ⇕ | RS | X | I,S*,AA | I,S,AA |
| NI | 0 | 0 | ⇕ | ⇕ | DS | ⇕ | DS | ⇕ | X | II,SS*,B,BB | II,SS,B,BB |
| I  | 1 | 0 | ⇕ | ⇕ | DS | ⇕ | DS | ⇕ | X | II,SS*,B,BB | II,SS,B,BB |
| NI | X | 5 | 0 | 6 | DS | ⇕ | ⇕ | RS | X | AA,B | AA,B |
| I  | X | 5 | 1 | 6 | DS | ⇕ | ⇕ | RS | X | AA,B | AA,B |
| NI | 0 | ⇕ | 0 | 7 | DS | X | RS | ⇕ | X | II,SS*,A,BB | II,SS,A,BB |
| I  | 1 | ⇕ | 1 | 7 | DS | X | RS | ⇕ | X | II,SS*,A,BB | II,SS,A,BB |
| NI | ⇕ | ⇕ | ⇕ | ⇕ | DS | X | RS | ⇕ | X | I,S*,BB | I,S,BB |
| I  | ⇕ | ⇕ | ⇕ | ⇕ | DS | X | RS | ⇕ | X | I,S*,BB | I,S,BB |
| NI | ⇕ | ⇕ | ⇕ | ⇕ | ⇕ | ⇕ | ⇕ | 0 | X | I,S*,II,SS* | I,S,II,SS |
| I  | ⇕ | ⇕ | ⇕ | ⇕ | ⇕ | ⇕ | ⇕ | 1 | X | I,S*,II,SS* | I,S,II,SS |

Fig 4A

| INVERT(I)/NON-INVERT(NI) | SELECT CONTROL $S_2$ $S_1$ $S_0$ | INVERT CONTROL $I_A$ $I_B$ | SELECT ENABLE $I_{S2}$ $I_{S1}$ $I_{S0}$ | DECODE A (MSB) A5 | A4–A1 | ENABLE A $I_{A5}$ | $I_{A1}$–$I_{A4}$ |
|---|---|---|---|---|---|---|---|
| NI / I | 1 0 0 | 1   0/1 | X 1 1 | X | X | 1 | 1 |
| NI / I | 1 0 0 | 1   0/1 | X 1 1 | X | X | 1 | 1 |
| NI / I | 1 0 0 | 1   0/1 | X 1 1 | ⊕ | X | 0 | 1 |
| NI / I | 1 0 0 | 1   0/1 | X 1 1 | 0 | X | ⊕ | 1 |
| NI / I | 1 0 0 | 1   0/1 | X ⊕ 1 | X | X | 1 | 1 |
| NI / I | 1 0 0 | 1   0/1 | X 1 ⊕ | X | X | 1 | 1 |
| NI / I | 1 0 0 | ⊕   0/1 | X 1 1 | X | X | 1 | 1 |
| NI / I | 1 0 0 | 0/1   ⊕ | X 1 1 | X | X | 1 | 1 |
| NI / I | 1 0 0 | 0/1   1 | X 1 1 | X | ⊕ | 1 | 0 |
| NI / I | 1 0 0 | 0/1   1 | X 1 1 | X | 0 | 1 | ⊕ |
| NI / I | 0 0 1 | 1   0/1 | 1 1 X | DSi | | 1 | 1 |
| NI / I | 0 0 1 | 1   0/1 | 1 1 X | DSi | | 1 | 1 |
| NI / I | 0 0 1 | 1   0/1 | ⊕ 1 X | DSi | | 1 | 1 |
| NI / I | 0 0 1 | 0/1   1 | 1 1 X | DSi | | 1 | 1 |
| NI / I | 0 0 1 | 0/1   1 | 1 1 X | DSi | | 1 | 1 |
| NI / I | 0 0 0 | 1   0/1 | 1 1 1 | DSi | | 1 | 1 |
| NI / I | 0 0 0 | 1   0/1 | 1 1 1 | DSi | | 1 | 1 |
| NI / I | 1 1 ⊕ | 1   0/1 | X X 0 | DSi | | 1 | 1 |
| NI / I | 1 ⊕ 1 | 1   0/1 | X 0 X | DSi | | 1 | 1 |
| NI / I | ⊕ 1 1 | 1   0/1 | 0 X X | DSi | | 1 | 1 |

| DECODE B | | ENABLE B | | INPUT C | ENABLE C | I/O$_j$ INPUTS | | I/O$_i$ OUTPUTS |
|---|---|---|---|---|---|---|---|---|
| (MSB) B5 | B4-B1 | I$_{B5}$ | I$_{B1}$-I$_{B4}$ | C1-3 | IC1-3 | I/O$_{1-13}$ | I/O$_{14-26}$ | I/O$_1$-I/O$_{26}$ |
| DSi | ⇕ | 1 | 1 | ⇕ | 0 | 0 | 0 | I/Oi |
| DSi | | 1 | 1 | 0 | ⇕ | 0 | 0 | I/Oi |
| DSi | | 1 | 1 | X | 1 | 0 | 0 | I/Oi |
| DSi | | 1 | 1 | X | 1 | 0 | 0 | I/Oi |
| DSi | | 1 | 1 | X | 1 | 0 | 0 | I/Oi |
| DSi | | 1 | 1 | X | 1 | 0 | 0 | I/Oi |
| DSi | | 1 | 1 | X | 1 | 0 | 0 | I/Oi |
| DSi | | 1 | 1 | X | 1 | 0 | 0 | I/Oi |
| DSi | | 1 | 1 | X | 1 | 0 | 0 | I/Oi |
| DSi | | 1 | 1 | X | 1 | 0 | 0 | I/Oi |
| DSi | | 1 | 1 | X | 1 | 0 | 0 | I/Oi |
| ⇕ | X | 0 | 1 | X | 1 | 0 | 0 | I/Oi |
| 0 | X | ⇕ | 1 | X | 1 | 0 | 0 | I/Oi |
| X | X | 1 | 1 | X | 1 | 0 | 0 | I/Oi |
| X | ⇕ | 1 | 0 | X | 1 | 0 | 0 | I/Oi |
| X | 0 | 1 | ⇕ | X | 1 | 0 | 0 | I/Oi |
| RSj | | 1 | 1 | X | 1 | ⇕ | 0 | I/Oi |
| RSj | | 1 | 1 | X | 1 | 0 | ⇕ | I/Oi |
| X | X | 1 | 1 | X | 1 | 0 | 0 | I/Oi |
| X | X | 1 | 1 | X | 1 | 0 | 0 | I/Oi |
| X | X | 1 | 1 | X | 1 | 0 | 0 | I/Oi |

Fig 4B

BI-DIRECTIONAL SWITCHING CIRCUIT

BACKGROUND OF THE INVENTION

1. Field of the Invention

This invention relates, in general, to a switching circuit for testing custom made Large Scale Integrated (LSI) circuits and more particularly to a bidirectional switching circuit for measuring a large number of AC data paths of macrocell arrays.

2. Background Art

To satisfy the demand for large scale digital integrated circuits, the semiconductor industry has developed three basic approaches. These include standard, off-the-shelf circuits; custom circuits; and gate arrays. The standard, off-the-shelf circuit provides the lowest cost option due to the quantities manufactured, but are limited in providing the flexibility for the circuit desired. The custom circuit is cost limiting unless the number of circuits desired is large. The gate array involves a standard array of a large number of gate circuits diffused into a chip. The metallization pattern converting these gate circuits into functional custom circuits is processed according to the customer's requirements.

A macrocell array is an extension of the gate array concept. Each cell in an array contains a number of unconnected transistors and resistors. A metallization interconnecting pattern transforms the interconnected transistors and resistors within each cell into Small Scale Integrated/Medium Scale Integrated logic functions, called macros. The macros take the form of standard logic elements such as dual type "D" flip flops, dual full adders, quad latches, and many other predefined functions. The macros are also interconnected by the metallization to form the desired LSI design. The high density packing of a macrocell array chip offers up to a fifty to one reduction in system component count, with a power dissipation improvement of as much as five to one.

These macrocell arrays are manufactured by modern technological processes to very precise standards. The propogation delay along AC data paths is measured in terms of nanoseconds. In order to insure user specifications are met and to confirm that the macros form the desired logic function, a testing sequence, or quality evaluation program, is normally conducted on each macrocell array produced. One known method of testing macrocell arrays involves the use of a Sentry VIII tester, produced by Fairchild Test Systems, probably the most advanced LSI general purpose tester that provides a large number of input/output (I/O) channels. The Sentry VIII tester is a computerized part tester that probes AC tests with 120 I/O channels and with a resolution of 160 picoseconds. There are seven pulse generators for producing pulses of different formats. The part being tested is placed on a load board having leads and terminals for coupling the part to the Sentry VIII. The term AC when used in AC tests refers to a signal with input to output transitions. Conversely, DC tests involve steady state currents and voltages having a high low state.

However, the overall accuracy of the Sentry VIII tester when measuring AC data paths of an LSI device is plus or minus three nanoseconds. Since some AC data paths on the device may have actual delays of only two nanoseconds and internal delays of less than one nanosecond, it would be beneficial to improve the accuracy of the testing method. Some of the reasons that the Sentry VIII is limited to an accuracy of three nanoseconds are as follows:

1. The general purpose testing of arrays requiring different inputs and outputs on various options sacrifices a transmission line environment by not matching input and output resistances.

2. The large number of I/O pins makes the load board difficult to design. "Open" lines must be used on inputs instead of terminated lines. Different lengths of line are used. Relays and other external components are required on the load board which add capacitance.

3. The rise and fall times of the drivers are slow (3–5 nanoseconds). Rise times of one nanosecond are used in laboratory measurements.

4. The output comparators used for measuring device outputs to a known reference voltage (threshold) has a response time dependent on the rise and fall times of the device being tested.

5. The pulse generators used to generate input signals and strobe pulses have skews between them due to differences in channel drivers.

6. The pulse generators in the Sentry VIII tester can be incremented in 0.16 nanosecond steps which means that repeated AC readings on the same device is ±0.16 nanosecond.

The accuracy of LSI testing has previously been improved to one nanosecond using a "Golden Unit/Silver Unit" approach. First, the device under test (the golden unit) is AC tested using a digital sampling scope while the circuit is in the load board on the Sentry tester. The Sentry tester measures the golden unit. The difference of the two readings for each measurement is stored in a deskew table. After this procedure is completed on all AC tests, several other units or macrocell arrays of the same option (called silver units) are tested with the Sentry tester and a deskew table is generated for each of the silver units. The silver units are used to deskew the machine prior to testing on a regular basis. By deskewing the machine, it is meant that the values read for each unit tested are adjusted according to the difference between the values read for the silver unit when first measured and just prior to testing each unit or group of units. For each option developed on the macrocell array, a golden unit must be measured manually (normal measurement procedure requires 3–4 hours per option) and about nine silver units must be tested and stored for deskewing the machine for that option only. This means that 10 units must be tested and stored for every option developed. Silver units are used for production testing since if the silver units get damaged, replacement silver units can be made from the gold unit without manually taking measurements.

For example, if 200 options of a macrocell array have been developed, 200 golden units must be measured and deskew tables generated for 1800 silver units. Obviously, this is a lot of units to be tested manually and stored for production testing. These problems are compounded as macrocell array options may number in the thousands. Since the amount of manual testing required is large, each option developed is limited to only a small number of AC paths for production testing.

Thus, what is needed is a bidirectional switching circuit that improves the accuracy and reduces the time required for testing different options of a macrocell array.

SUMMARY OF THE INVENTION

Accordingly, it is an object of the present invention to provide a bidirectional switching circuit wherein the accuracy of test results for macrocell array options is improved.

Another object of the present invention is to provide a bidirectional switching circuit wherein the required time for testing different options of the macrocell array is reduced.

In carrying out the above and other objects of the invention in one form, there is provided a bidirectional switching matrix with inversion having a plurality of terminals including input/output terminals, select terminals, a first inverting terminal, and a second inverting terminal. A first logic means is coupled to the terminals for providing a bidirectional path between any of the terminals, and a second logic means is coupled to the terminals and the first logic means for selecting a desired path according to the signals applied to the select terminals and the inverting terminals.

The above and other objects, features, and advantages of the present invention will be better understood from the following detailed description taken in conjunction with the accompanying drawings.

BRIEF DESCRIPTION OF THE DRAWINGS

FIG. 2 illustrates the AC deskew function table for the general case of FIG. 1.

FIG. 4A illustrates a first portion of the AC deskew function table for the second embodiment of FIG. 3.

FIG. 4B illustrates a second portion of the AC deskew function table for the second embodiment of FIG. 3.

DETAILED DESCRIPTION OF THE INVENTION

Figure 1:
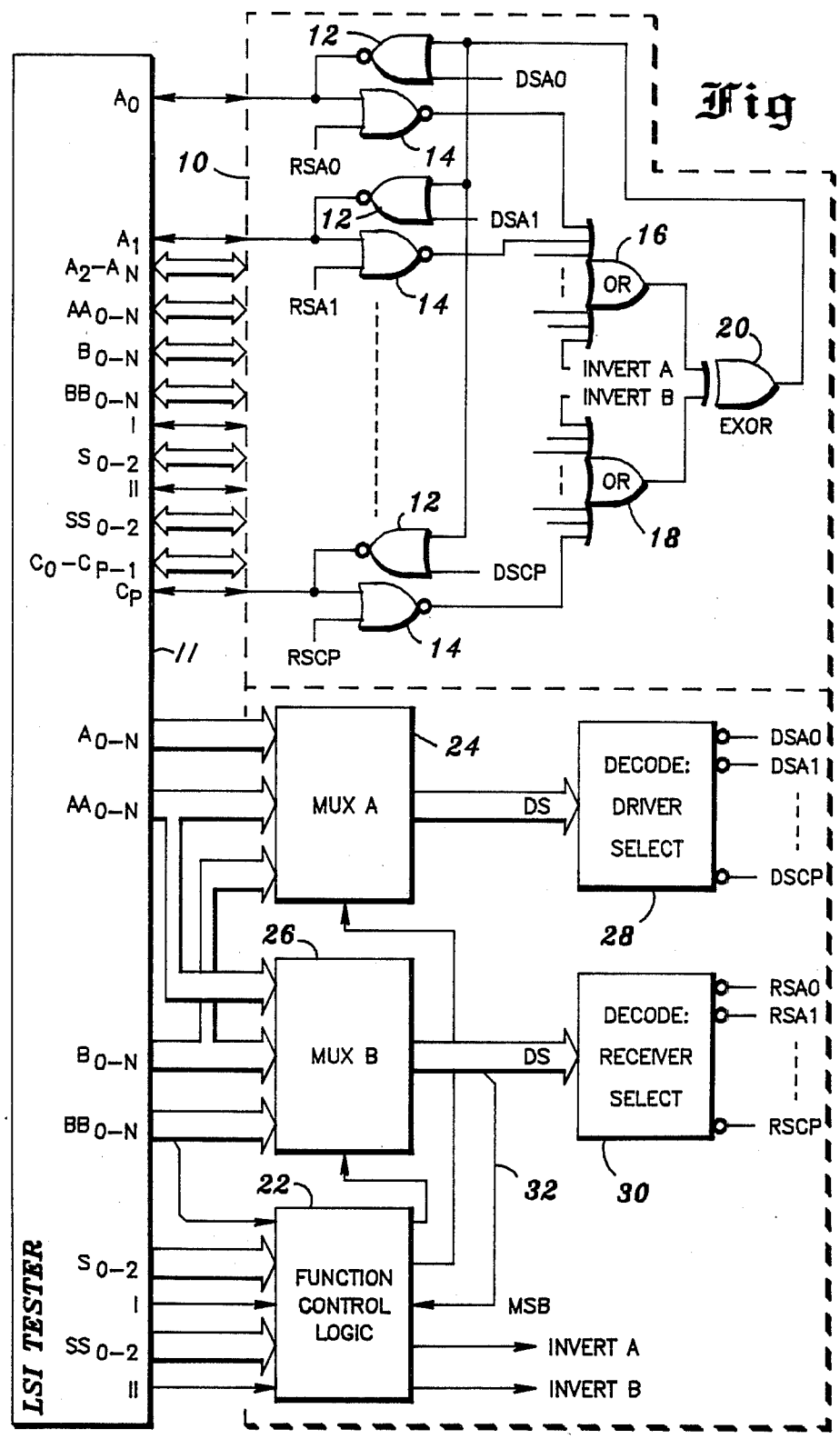
FIG. 1 illustrates in logic and block diagram form the general case of the bidirectional switching matrix of the invention.

Referring to FIG. 1, a logic and block diagram illustrates the integrated circuit 10 of the invention. Input/output (I/O) pins $A_2$ through $A_N$, $AA_0$ through $AA_N$, $B_0$ through $B_N$, and $BB_0$ through $BB_N$ are represented by wide arrows indicating a plurality of pins, where N may be any integer. $A_0$ and $A_1$ are shown singularly. The input or output function of the pins are represented by bidirectional arrows. Six select pins $S_0$ through $S_2$ and $SS_0$ through $SS_2$, represented by wide arrows, and two inverting pins I and II, having bidirectional capabilities, are provided. Additional I/O pins include $C_O$ through $C_P$ where P may be any integer, and are also represented by wide arrows. Pins $A_0$ through $A_N$, $AA_0$ through $AA_N$, $B_0$ through $B_N$, $BB_0$ through $BB_N$, $S_0$ through $S_2$, $SS_0$ through $SS_2$, $C_0$ through $C_P$, I and II are all connected to LSI tester 11.

I/O pin $A_0$ is connected to the output of one of a number of drivers 12 and to one input of one of a number of receivers 14. Likewise, I/O pin $A_1$ is connected to the output of another driver 12 and to one input of another receiver 14. Each of the terminals $A_2$ through $C_P$ are similarly connected to receivers 12 and drivers 14. The receivers 12 and drivers 14 are shown as NOR gates; however, other logic gates would work equally well with corresponding logic gate changes.

Outputs of half of the receivers 14 are connected to the inputs of OR gate 16 and outputs of the other half of the receivers 14 are connected to the input of OR gate 18. The outputs of OR gate 16 and OR gate 18 are connected to the input of exclusive OR gate 20. The output of exclusive OR gate 20 is connected to one input of each of the drivers 12. The OR gates 16 and 18 may alternatively comprise ECL logic wire ORing. Similarly, for TTL compatible logic, a wired AND could be used in place of the OR gate 16 and 18. All the line links in the AC path should be matched on the circuit to achieve approximately equal delays. Since identical driver and receiver circuits are used on a monolithic substrate, approximately equal delays are possible.

In order to select the input to output path, a unique select and coding scheme is used with some of the I/O pins serving dual functions. Six select pins $S_0$ through $S_2$ and $SS_0$ through $SS_2$, one BB pin, plus two inverting pins I and II are used for function select control and are connected to the function control logic 22. The function control logic 22 is connected to multiplexers 24 and 26 and controls the output therefrom. A dual address scheme is used to select the appropriate driver 12 and receiver 14 for the selected input to output path. I/O pins $A_0$ through $A_N$, $AA_0$ through $AA_N$, and $B_0$ through $B_N$ are connected to multiplexer 24 and I/O pins $B_0$ through $B_N$, $BB_0$ through $BB_N$ and $AA_O$ though $AA_N$ are connected to multiplexer 26. In order to use the address pins as an input to output path, a dual address is required. Multiplexer 24 is connected to decode driver select 28 and controls the address selection for the driver select decode, while multiplexer 26 is connected to decode receiver select 30 and controls the address selection for the receiver select decode. It should be noted that I/O pins $A_0$-$A_N$ are not connected to multiplexer 26 since they are not used for decoding receiver select 30. Also, I/O pins $BB_0$-$BB_N$ are not connected to multiplexer 24 since they are not used for decoding driver select 28. The number of lines (N+1) needed for decoding the driver 12 or receiver 14 is dependent on the total number of I/O pins and is determined from the following equation:

Number of I/O pins = $4(N+1)+8+P$ where $2^{N+1}$ is greater than or equal to the number of I/O pins and where N+1 is the number of A, AA, B or BB input/output pins and P is the number of C input/output pins.

For example, for 64 I/O pins, six pins are needed for address selection of the driver 12 and six pins are needed for address selection of the receiver 14. In other words, for 64 I/O pins, $2^{N+1}=64$ and N=5. Therefore, from the above equation, P equals 32. Therefore, the circuit would have six each A, AA, B, and BB I/O pins, eight selection I/O pins (I, II, $S_{0-2}$, $SS_{0-2}$) and thirty two C I/O pins.

The outputs from decode driver select 28 comprises $DSA_0$ through $DSC_P$ and are applied individually to the respective drivers 12. The output from decode receiver select 30 comprises $RSA_0$ through $RSC_P$ and are applied individually to the respective receivers 14. Invert A and B signals from function control logic 22 are connected to OR gate 16 and 18 inputs, respectively.

Therefore, the general approach just described may be applied to any package type and pin configuration as well as any logic family (ECL, TTL, CMOS, etc.). All pins (except power pins) are bidirectional (I/O) ports.

The power pins are not shown in FIG. 1 and may be ignored for the testing procedure, unless a power pin is used for a signal, in which case the power pin would be handled as an input/output pin. Any pin can be an input which can be digitally connected to any of the other pins with or without inversion. The design is entirely combinatorial in which sequential logic is not required. Separate pins devoted to selecting the AC path are not required. Instead, the addressing of the selected AC path is done uniquely by using the I/O pins. The design also provides matched delayed paths of only four gate delays (3 gate delays if wire ORing is used) from all inputs to all outputs. Another important feature is that all four propagation delay transitions are possible (++, −−, +−, −+) due to the inverting/non-inverting feature of the design. In other words, rising (+) or falling (−) transitions of the pulse for both input and output may be recorded for all four possibilities. To eliminate transmission line reflections when driving an I/O pin with an input signal, the output gate is off or in the high impedance state.

Referring now to FIG. 2, a Function Table is shown for selecting all the input to output paths including inversion. The first major column (on the left) describes whether the signal is inverted or non-inverted and is represented by I and NI, respectively. NI signifies a ++ or a −− and I signifies a +− or a −+. The second major column is Select Control and describes the signal to be applied to the invert pins I and II and the select pins $S_0$ through $S_2$ and $SS_0$ through $SS_2$. A represents an input or output pulse and a represents an inverted input or output pulse. An X represents a "dont't care", which may be either a "1" or a "0". Note further, that a or a in the select pin columns represents a pulse on any of the select pins, and an integer represents a binary input equating that integer. The third major column is Decode Input and describes the function of input pins A, AA, B, and BB. A DS or RS signify that the signal on those pins are passed to decode driver select 28 and decode receiver select 30, respectively. Inputs not being used for address or function select are labeled $C_0$ through $C_P$. The column titled AC Propagation Path identifies which pins may be used for input and output. However, the selectable input pins marked with an asterisk cannot be coupled to a selectable output pin having the same identifier. For example, I/O pin S* cannot be coupled to another I/O pin S. These couplings are prevented by the necessity to use the I/O pins S or SS for selection logic.

For example, in the first line, when a digital "0" is placed on inverting pin I and a binary "7" is placed on select pins $S_0$ through $S_2$, the binary code on I/O pins $A_0$ through $A_N$ pass multiplexer 24 to the decode driver select 28 and control signals $DSA_0$ through $DSC_P$. Likewise, the digital code on I/O pins $B_0$ through $B_N$ pass multiplexer 26 to the decode receiver select 30 and control signals $RSA_0$ through $RSC_P$. Therefore, an AC pulse may be placed on the designated I/O pins II, SS, AA, BB, or C, with an output appearing on the designated I/O pin II, SS, AA, BB, or C. The designated output pin must be different from the designated input pin so that the input and output will not both be on the same pin.

The select pins and internal logic determine the selectable I/O pins in the following manner. A binary 7 on select pins S select I/O pins II, SS, AA, BB, and C ($F_1 = S_2 * S_1 * S_0$ where "F" represents a function comprising a pair of lines designated by NI and I in FIG. 2 and the "S" and "SS" terms represent select pins shown as columns in FIG. 2). A binary 5 on select pins SS, when select pin S is not a binary 7, utilize I/O pins I, S, A, B, and C ($F_2 = SS_2 * SS_1 * SS_0 * F_1$). A binary 3 on select pins SS, when select pin S is not a binary 7, select I/O pins I, S*, A, and AA ($F_3 = SS_2 * SS_1 * SS_0 * F_1$). A binary 3 on select pin S, when select pins SS is not a 5, select I/O pins II, SS*, B, and BB ($F_4 = S_2 * S_1 * S_0 * (SS_2 * SS_1 * SS_0)$). A binary 6 on select pins SS, when select pin S is not a 7, select I/O pins AA, and B ($F_5 = SS_2 * SS_1 * SS_0 * F_1$). A binary 5 on select pin S, when select pins SS is not a 5, select I/O pins II, SS*, A, and BB ($F_6 = S_2 * S_1 * S_0 (SS_2 * SS_1 * SS_0)$). A binary 7 on select pins SS select I/O pins I, S*, and BB ($F_7 = SS_2 * SS_1 * SS_0$). When none of the above binary states are present on select pins S and SS, or, in other words, when the allowed binary states are "0", "1", "2" or "4", I/O pins I, S*, II, and SS* are selected ($F_8 = F_1 * F_2 * F_3 * F_4 * F_5 * F_6 * F_7$). I/O pin $BB_0$ and the most significant bit (MSB) returned to the Function Control Logic via line 32 control the invert A and invert B inputs of OR gates 16 and 18.

The Driver Select (DS) function may be determined from the equation as follows:

$$DS = A_{0-N}(F_1 + F_4 + F_5 + F_7 + F_8) + AA_{0-N}(F_2 + F_6) + B_{0-N} * F_3$$

DSA0 to DSCP outputs are active low as decoded from select line DS. For example,
 DSA0 = DS0*DS1*DS2* ... *DSN
 DSA1 = DS0*DS1*DS2* ... *DSN
 DSA2 = DS0*DS1*DS2* ... *DSN
 DSCP = DS0*DS1*DS2* ... *DSN The receiver Select (RS) function may be determined from the equation as follows:

$$RS = B_{0-N}(F_1 + F_6 + F_7 + F_8) + BB_{0-N}(F_2 + F_3 + F_5) + AA_{0-N} * F_4$$

RSA0 to RSCP outputs are active low as decoded from select lines RS. For example:
 RSA0 = RS0*RS1*RS2* ... *RSCP
 RSA1 = RS0*RS1*RS2* ... *RSN
 RSA2 = RS0*RS1*RS2* ... *RSN
 RSCP = RS0*RS1*RS2* ... *RSN
Then INVERT
$A = (F_1 * I + F_2 * II + F_3 * II + F_4 * I + F_5 * II + F_6 * I + F_7 * II + F_8 * BB_0) MSB$ INVERT
$B = (F_1 * I + F_2 * II + F_3 * II + F_4 * I + F_5 * II + F_6 * I + F_7 * II + F_8 * BB_0) MSB$ where MSB is the most significant bit of RS or RSN.

A special case of the invention shall now be considered by describing the MCA1200ECL macrocell array as developed by the assignee. This array comprises 106 total cells including 48 major cells, 32 interface cells, and 26 output cells.

A maximum of 340 propagation delay measurements (85 data paths) are all that are required for this special case. These delay measurements are made under laboratory conditions, i.e. terminated transmission line environment; equal line lengths; and digital sampling scopes. From these 340 measurements, all possible data paths (a total of 6136 readings) can be calculated with an accuracy of less than ±60 picoseconds. If all 6136 readings were taken in the laboratory, an accuracy of ±20 picoseconds can be achieved for all data paths. The laboratory measured unit (special case) is called a "Platinum Unit" since it has a higher accuracy than the previous "Gold Units". The platinum unit can be used to deskew all possible data paths for the production tester (the invention is not limited to Sentry tester). In other words, only one device is needed to deskew the AC tester for all options developed from the macrocell array. Also, it is anticipated that the accuracy of the AC readings that are measured on the Sentry tester will be less than ±0.4 nanosecond (compared to ±1 nanosecond previously). If an AC tester had a resolution of 10 picoseconds, then the accuracy of the tester using a platinum unit would be less than ±0.2 nanosecond. In other words, accuracy using the platinum unit is determined to a high degree by the resolution capability of the tester. Also, due to the matched delays of all data paths in the invention, it is anticipated that only four laboratory measurements will be required to calculate all data paths. Using this approach to generate extra platinum units, the accuracy of the AC tester readings is estimated to be less than ±0.5 nanosecond.

Using the "platinum unit" approach, manual AC testing is no longer required for each different option developed. A complete option evaluation package may be obtained showing the longest and shortest delay paths for all inputs to all outputs with accuracies of ±0.5 nanosecond. Software has already been generated to automatically measure all input to output data paths from the functional truth table. Also, setup and hold times could be measured accurately with the tester since all the signal generators can be easily calibrated using the platinum unit approach.

Figure 3:
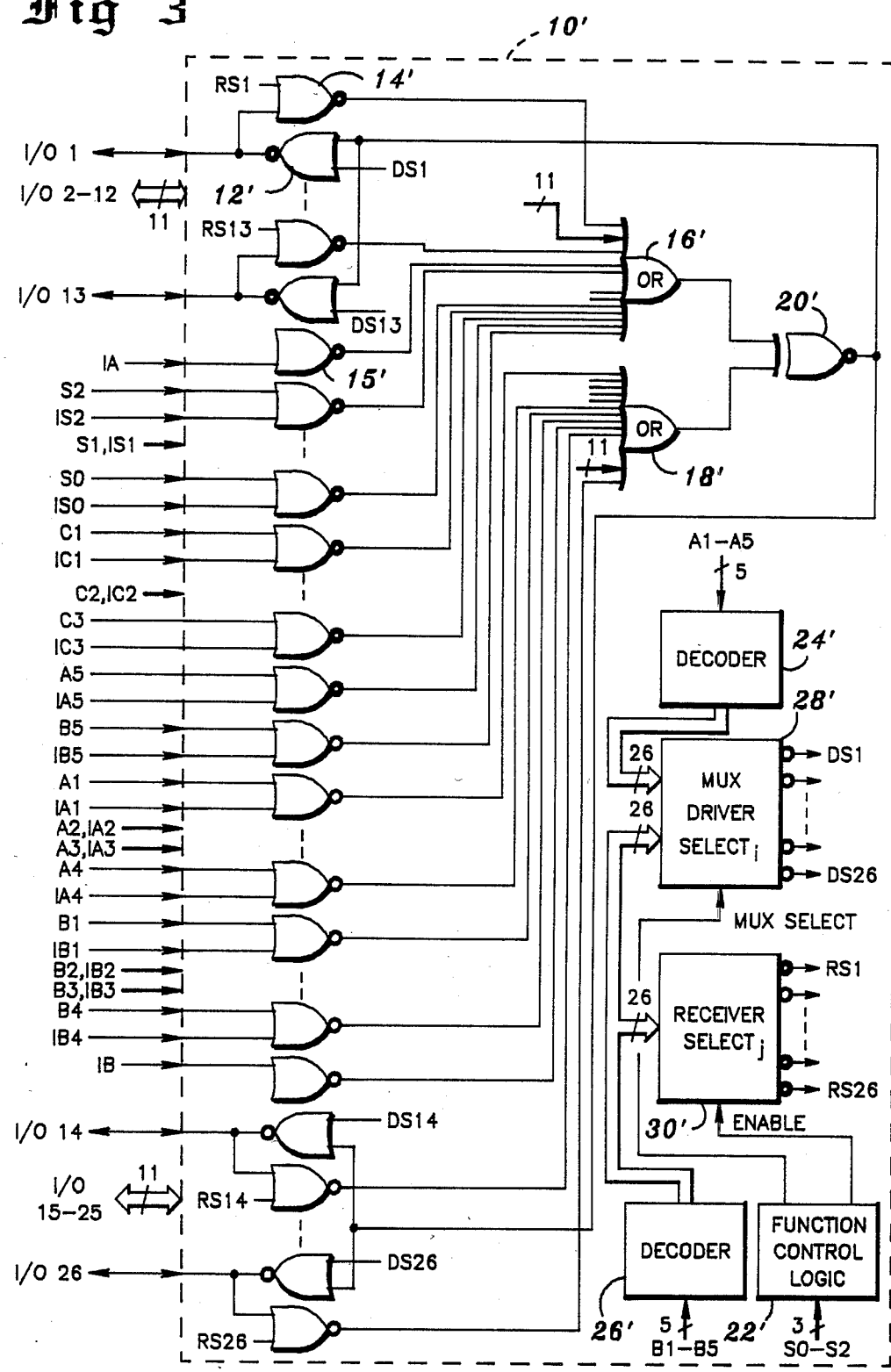
FIG. 3 illustrates in logic and block diagram form a second embodiment showing a detailed case of the bidirectional switching matrix of the invention.

Referring now to FIG. 3, a logic and block diagram illustrates the integrated circuit 10' of the specific case of the invention. Wide arrows represent a multiple of pins or lines for simplicity of illustration. The integrated circuit 10' has I/O pins 1-26, select pins $S_0$ through $S_2$ and $IS_0$ through $IS_2$, input pins $A_1$ through $A_5$, $IA_1$ through $IA_5$, $B_1$ through $B_5$, $IB_1$ through $IB_5$, $C_1$ through $C_3$, $IC_1$ through $IC_3$ and invert pins IA and IB. Since only I/O pins 1-26 are bidirectional, the remaining 34 pins are used for select and address decoding and are input-only pins.

I/O pin 1 is connected to the output of 1 of 26 drivers 12' and to one input of one of twenty six receivers 14'. The remaining I/O pins 2-26 are connected similarly to drivers 12' and receivers 14'. The drivers 12' and receivers 14' are shown as NOR gates; however, any convenient logic gates work equally as well. The input-only pins enable 2-input NOR gates 15'. Alternatively, 3 or even 4-input NOR gates could be used; however, the use of two-input NOR gates 15' is a more efficient logic utilization when using a macrocell array. Outputs from half the receivers 14' are connected to the inputs of OR gate 16' and outputs from the other half of receivers 14' are connected to the input of OR gate 18'. The outputs of OR gate 16' and 18' are connected to the input of exclusive NOR gate 20'. The output of exclusive NOR gate 20' is connected to one input of each of the drivers 12'. As in the general case, the OR gates 16' and 18' may alternatively comprise ECL logic wire ORing. Similarly, for TTL compatible logic, a wired AND could be used in place of the OR gate 16' and 18'. All the line lengths in the AC path should be matched on the circuit to achieve approximately equal delays. Three select pins $S_0$ through $S_2$ are used for function select control and are connected to the function control logic 22'. The function control logic is connected to multiplexer driver select 28' and multiplexer receiver select 30' and controls the output therefrom. A dual address scheme is used to select the appropriate driver 12' and receiver 14' for the selected input to output path. Input only pins $A_1$ through $A_5$ are connected to decoder 24' and input only pins $B_1$ through $B_5$ are connected to decoder 26'. Decoder 24' is connected to multiplexer driver select 28' and decoder 26' is connected to both multiplexer driver select 28' and multiplexer receiver select 30'. The outputs from multiplexer driver select 28' are connected to drivers 12'. The outputs from multiplexer receiver select 30' are connected to receivers 14'.

Although the special case was designed for matched input to output delays, a maximum of 200 picoseconds skew difference is expected. By taking four measurements $t_{pd}++$, $--$, $+-$, and $-+$ on one path, where $t_{pd}$ is the time of propagation delay, all other paths should be within 200 picoseconds of the readings. The reason for the delay skew is that slight delay difference will occur due to package pin length, pin capacitance and gate delay skews.

If the 200 picoseconds should turn out to be larger, or if a better accuracy is required, a maximum of 340 laboratory measurements of 85 data paths will enable the calculation of all data paths due within ±60 picoseconds. This assumes that the measurements are accurate to ±20 picoseconds. The 85 data paths are as follows:

1. All inputs (59 total excluding the primary reference output) to one primary reference output.
2. One reference input to all the other 25 outputs.
3. The primary reference output used as an input to another output.

Two equations have been derived to calculate all 6,136 possible propogation delay transitions based on laboratory measurements of the 85 data paths. The derivations are as follows:

Let
A = The reference input
B = The primary reference output
C = The secondary reference output
i = Each input pin
j = Each output pin
K(i) = The input skew of pin i with reference to input A
L(j) = The output skew of pin j with reference to output B
$t_{pdx}(i,j)$ = The calculated delay from input i to output j
$t_{pdm}(i,j)$ = The measured delay from input i to output j
$t_{pdm}(A,B)$ = The measured delay for the reference path input A to output B
K(A) = 0 and L(B) = 0 since all delays are included in the reference measurement $t_{pdm}(A,B)$ Then $$K(i) = t_{pdm}(i,B) - t_{pdm}(A,B) \text{ except for } i=B \quad (1)$$
$$K(B) = t_{pdm}(B,C) - t_{pdm}(A,C) \quad (2)$$
$$L(j) = t_{pdm}(A,j) - t_{pdm}(A,B) \quad (3)$$

The general equation is:

$$t_{pdx}(i,j) = K(i) + t_{pdm}(A,B) + L(j) \quad (4)$$

where K(i) is the input skew of the input package pin and socket, the skew of the input NOR gates 14' and 15', OR gates 16' and 18', and exclusive NOR gate 20', and the metal skew at the output of NOR gate 14' and 15' and OR gates 16' and 18'. The L(j) is the output skew of output package pin and socket, the skew of drivers 12', and the metal skew at the output exclusive NOR gate 20' and driver gates 12'.

Using equation (4), 172 measurements are required: four measurements $(++,--,+-,-+)$ on the reference path and two measurements $(++,--)$ each on the other 84 data paths. From these measurements $t_x(i,j)$ can be calculated with an accuracy of approximately ±100 picoseconds assuming that each of the measurements is accurate to ±20 picoseconds.

By substituting equations 1 through 3 into equation 4, the following equations are written:

$$t_{pdx}(i,j) = t_{pdm}(A,B) + t_{pdm}(i,B) + t_{pdm}(A,j) \quad (5)$$

except where $i = B$ $$t_{pdx}(B,j) = -t_{pdm}(A,C) + t_{pdm}(B,C) + t_{pdm}(A,j) \quad (6)$$

Using equations 5 and 6, $t_{pdx}(i,j)$ can be calculated with an accuracy of ±60 picoseconds. However, 340 measurements $(++,--,+-,-+)$ are required on 85 data paths.

Equations 5 and 6 can be reduced to one equation by substituting equation 3 into equation 4. The result is equation 7:

$$t_{pdx}(i,j) = K(i) + t_{pdm}(A,j) \quad (7)$$

where K(i) is defined in equations 1 and 2.

The input coefficients (K[I]) and the output delays ($t_{pdm}$[A,j]) are related to the on-chip parameters. Therefore, these values can be generated on other units by taking only four measurements on the primary reference path. All the coefficients are increased or decreased by the percent difference when comparing the reference path measurements to those taken on the "platinum" unit. The accuracy of this approach will add approximately 50 picoseconds to the error when using units from the same lot and approximately 100 picoseconds when units are from different lots.

The same input to output transition $(++,--,+-,$ or $-+)$ must be used for each term in the equation. For instance, if $++$ transition of tpd(i,j) is to be calculated, then all the measured values in the equation must be $++$ transition.

Also

Skew $(i,j) = t_{pdx}(i,j) - t_{pdT}(i,j)$.

Skew $(B,J) = t_{pdx}(B,j) - t_{pdT}(B,j)$.

$t_{pdT}$ are tester measurements of a platinum unit. $t_{pdx}$ are calculated delays from equations 5 and 6. Skew is the difference from laboratory delay measurements and tester delay measurements of the same platinum device. A table of skew values for each transition $(++, --, +-, -+)$ can be stored in the tester's memory and used to correct all subsequent delay measurements taken from any input to any output. The resulting accuracy on a Sentry VIII tester is calculated to be less than 0.4 nanoseconds. In addition to propagation delays, set-up and hold measurements can also be performed accurately (two skew tables, one for each pulse generator, can be stored in memory of a computer program that controls the Sentry VIII test sequence).

A function table is shown in FIG. 4A and 4B for selecting all the input to output paths including inversion for the special case of FIG. 3. This function table is to be interpreted similarly to the function table of the general case in FIG. 2, except DS$_i$ is the multiplexer driver select 28' output for I/O 1 through 26 and RS$_i$ is the receiver select 30' input for I/O 1 through 26, where i and j are the decimal equivalent for the binary code of decoder 24' or decoder 26' plus "1". Where a or pulse is shown at more than one input, only one input is actually pulsed at a given time and the other and inputs are maintained at a logic "1" and the I/O inputs are maintained at a logic "0".

By now it should be appreciated that there has been provided a bi-directional digital switching matrix with inversion that improves the accuracy and reduces the time required for testing AC data paths of different options of a macrocell array.

We claim:

1. A bi-directional switching circuit having a plurality of pins, including input/output pins, select pins, and at least one inverting pin, said plurality of pins receiving a plurality of signals, said input/output pins including a first group of input/output pins, a second group of input/output pins, and a third group of input/output pins, for providing a data path between any of said plurality of pins, wherein said bi-directional switching circuit is coupled to an LSI tester, said tester applying a plurality of test signals to said plurality of pins and recording a first delay of each of said plurality of test signals from one of said plurality of pins to another, said first delay then being compared to a second delay of an LSI array by comparing said first delay and said second delay to a prerecorded third delay from said bi-directional switching circuit, for deskewing said second delay of said LSI array, said bi-directional switching circuit comprising:
   first logic means coupled to said plurality of pins for providing a bidirectional path with selectable inversion between any of said plurality of pins; and
   second logic means coupled to said plurality of pins and said first logic means for selecting a path according to the signals applied to said select pins and said at least one inverting pin.

2. The circuit according to claim 1 wherein said second logic means comprises:
   a first multiplexer coupled to said first group of input/output pins;
   a second multiplexer coupled to said second group of input/output pins;
   a decode driver select coupled to said first multiplexer and having a plurality of outputs coupled to said first logic means;
   a decode receiver select coupled to said second multiplexer and having a plurality of outputs coupled to said first logic means; and
   a logic control circuit coupled to said third group of input/output pins and said first and said second multiplexers.

3. The circuit according to claim 2 wherein said first logic means comprises:
   a plurality of receiver logic gates;
   a plurality of driver logic gates, each one of said plurality of pins coupled to a first input of one of said receiver logic gates and coupled to the output of one of said driver logic gates;
   a third logic means having a plurality of inputs and an output, an output of more than one of said receiver logic gates coupled to said inputs of said third logic means;
   a fourth logic means having a plurality of inputs and an output, an output of more than one of said receiver logic gates coupled to said inputs of said fourth logic means wherein not one of said receiver logic gates outputs are coupled to both of said third and fourth logic gates; and a fifth logic gate having a first input and a second input and an output, said inputs coupled to said outputs of said third and fourth logic gates, said output coupled to a first input of each of said driver logic gates.

4. The circuit according to claim 3 wherein said receiver logic gates and said driver logic gates are NOR gates.

5. The circuit according to claim 3 wherein said third logic gate and said fourth logic gate are OR gates.

6. The circuit according to claim 3 wherein said fifth logic gate is an exclusive OR gate.

7. A bidirectional switching circuit with selectable inversion for providing a matrix of AC data path time values as measured by a tester, wherein values from subsequently tested circuits may be compared, thereby providing a standardized set of values for each circuit tested, said circuit having a plurality of pins, including input/output pins, select pins, and at least one inverting pin, comprising:

a first logic means coupled to said plurality of pins for providing a bi-directional path with selectable inversion between any of said plurality of pins; and a second logic means coupled to said plurality of pins and said first logic means for selecting a path according to the signals applied to said select pins and said inverting pins.

8. A method of selecting one of a multiple of data paths on an integrated circuit having a plurality of pins including input/output pins, select pins, and at least one inverting pin, wherein any one of the plurality of pins is coupled to one other of the plurality of pins to form a data path for applying a test signal, the method comprising the steps of:

selecting a group of the input/output pins according to a binary signal applied to the select pins;

decoding signals on the group of input/output pins selected; and coupling one of the plurality of pins to another one of the plurality of pins according to the decoded signals on the group of input/output pins.

9. The method according to claim 8 further comprising the step of inverting the test signal.

10. A method of determining the AC delay of at least one data path on a test macrocell array having a mask and metallization pattern defining logic functions, comprising the steps of:

selecting a group of input/output pins according to a binary signal applied to select pins on a bi-directional macrocell array having a mask substantially similar to the mask of the test macrocell array, but which need not have similar logic functions, to form a circuit having a plurality of pins including the input/output pins, the select pins, and at least one inverting pin, wherein any one of the plurality of pins is coupled to one other of the plurality of pins to form a data path;

decoding signals on the portion of input/output pins selected;

coupling one of the plurality of pins to another one of the plurality of pins according to the decoded signals on the portion of input/output pins;

applying a test signal to one of the coupled pins during a first time period;

recording in a skew table the value of the AC delay time of the test signal between the coupled pins;

comparing the recorded AC delay time of the first time period with the delay time of the same data path during a second time period;

applying a test signal during the second time period to one of two coupled pins of the test macrocell array, the two coupled pins of the test macrocell array being corresponding pins of the bi-directional macrocell array; and adjusting the delay times of the bi-directional macrocell array for each data path according to the values in the skew table.

* * * * *